United States Patent [19]

Ouellette

[11] Patent Number: 4,537,461

[45] Date of Patent: * Aug. 27, 1985

[54] LEAD HAVING A SOLDER-PREFORM AND PREFORM-CARRYING FINGER ENGAGEABLE DIRECTLY WITH A CONTACT PAD

[75] Inventor: Paul J. Ouellette, Amesbury, Mass.

[73] Assignee: AT&T Technologies, Inc., Berkeley Heights, N.J.

[ * ] Notice: The portion of the term of this patent subsequent to Feb. 19, 2002 has been disclaimed.

[21] Appl. No.: 402,684

[22] Filed: Jul. 28, 1982

[51] Int. Cl.³ .................... H01R 11/22; H01R 4/02
[52] U.S. Cl. ............................ 339/258 R; 339/275 B
[58] Field of Search ............ 339/17 C, 17 LM, 17 M, 339/258 R, 258 P, 275 B, 275 T, 275 R

[56] References Cited

U.S. PATENT DOCUMENTS

| | | | |
|---|---|---|---|
| 3,351,704 | 11/1967 | Sitzler | 174/84 |
| 3,750,252 | 8/1973 | Landman | 29/191.6 |
| 4,019,803 | 4/1977 | Schell | 339/275 B |
| 4,120,558 | 10/1978 | Seidler | 339/275 T |
| 4,203,648 | 5/1980 | Seidler | 339/275 T |
| 4,302,067 | 11/1981 | Monson et al. | 339/275 R |
| 4,345,814 | 8/1982 | Gutbier et al. | 339/275 R |
| 4,357,069 | 11/1982 | Milora | 339/275 R |
| 4,433,892 | 2/1984 | Seidler | 339/258 P |

Primary Examiner—Gil Weidenfeld
Assistant Examiner—Gary F. Paumen
Attorney, Agent, or Firm—D. D. Bosben

[57] ABSTRACT

A solder-bearing lead (10) includes a contact clamping finger (20) having an arcuate, reverse-bent clamping portion (34) which is wrapped about a solder preform (12) so that a surface portion (24) of the preform and an outer end surface portion (22) of the contact finger both directly engage a contact pad (14) on a substrate circuit device (16) when the lead is mounted on the device. When the lead (10) is temporarily subjected to heat in a soldering operation, the solder preform (12) melts and flows directly over the contact pad (14) and then resolidifies to form a soldered connection (28) having the outer end surface portion (22) of the reverse-bent clamping portion (34) of the contact clamping finger (20) embedded in the soldered connection in firm engagement with the contact pad (14).

8 Claims, 5 Drawing Figures

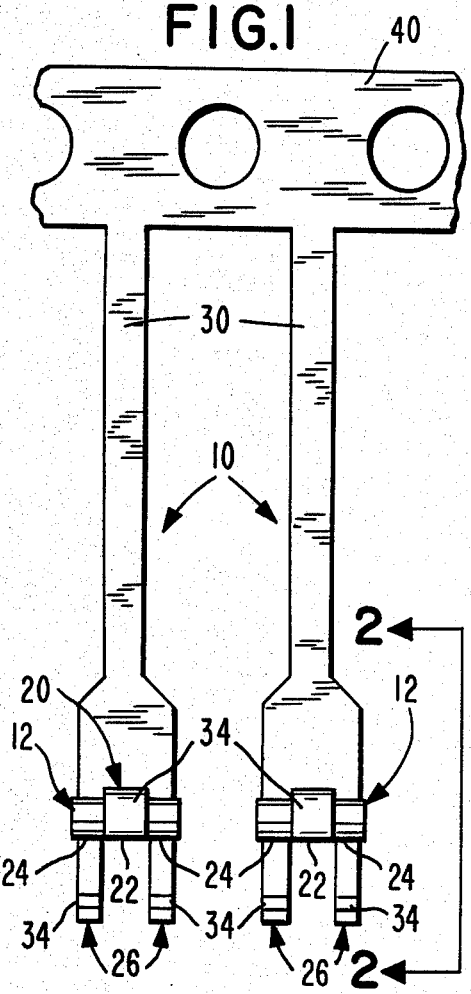
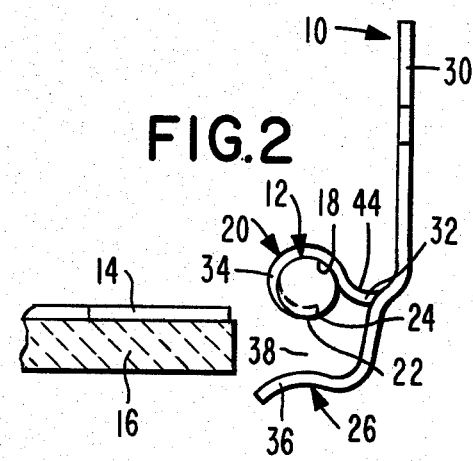
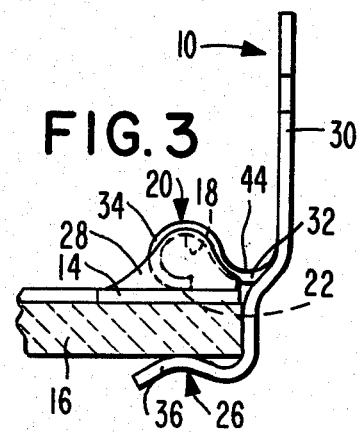
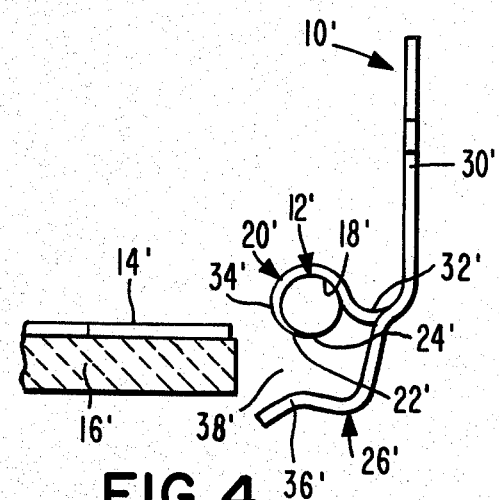
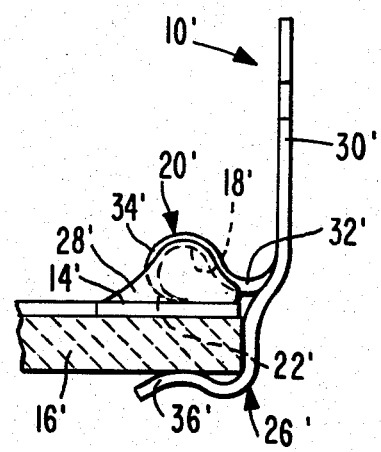

LEAD HAVING A SOLDER-PREFORM AND PREFORM-CARRYING FINGER ENGAGEABLE DIRECTLY WITH A CONTACT PAD

TECHNICAL FIELD

This invention relates to a solder-bearing lead having a solder-perform and a perform-carrying finger engageable directly with a contact pad, and more particularly to a solder-bearing lead having a contact finger which is wrapped about a solder perform so that the preform and an outer end surface portion of the contact finger directly engage a contact pad on a substrate circuit device when the lead is mounted on the device.

BACKGROUND OF THE INVENTION

A solder-bearing lead is known in which the lead includes opposed resilient clamping fingers at one end of an elongated stem, with at least one of the fingers defining an electrical contact. The clamping fingers include opposed inner surfaces which define a gap for the reception of a rigid substrate circuit device therebetween, such that the inner surface on the electrical contact clamping finger engages a contact pad on the substrate circuit device. On an outer opposite surface of the contact clamping finger, the contact clamping finger carries a solder preform. The solder preform, upon being temporarily subjected to heat in a soldering operation, initially melts and flows over opposite sides of the contact finger onto the contact pad, and then resolidifies to bond the lead to the contact pad. Solder-bearing leads of this type are shown in U.S. Pat. No. 4,019,803 to M. S. Schell, and U.S. Pat. Nos. 4,120,558 and 4,203,648 to J. Seidler.

Solder-bearing leads as above described normally are fabricated in strip form in a progressive punch-and-die from a strip of phosphorous bronze base metal which has been provided with thin tin coatings on opposite sides thereof, to facilitate the subsequent making of electrical connections to the leads. During the lead fabrication process in the progressive punch-and-die, a continuous solder wire is attached to the contact fingers of the leads and subsequently clipped between the leads to form the solder preforms on the leads. Further, during the lead fabrication process the stems of the leads are formed integrally with an elongated continuous support rail which subsequently is clipped from the stems after the leads have been mounted on a substrate circuit device and soldered to respective contact pads on the device.

In fabricating the solder-bearing leads from a tin-coated phosphorous bronze strip as above-described, while portions of one of the tin coatings are wiped across a portion of the thickness of the base metal so as to coat the base metal, a major portion of the base metal thickness usually is not coated in this manner and is exposed to the atmosphere. When each lead then is mounted on a substrate circuit device the portion of the solder preform held by the contact finger of the lead is separated from the contact pad with which the contact finger is engaged, by phosphorous bronze base metal which, as a result of oxidation from exposure to the atmosphere, is not readily wetted by solder. Accordingly, instead of flowing down onto the contact pad in a soldering operation, the solder from the melted preform normally flows along the solder-wettable tin coating of the lead on the lead stem in a "wicking" action. Similarly, molten solder which does flow down to the contact pad then flows along the solder-wettable tin coating on the opposite side of the lead stem in a "wicking" action. Either flow is undesirable because the solder contaminates the tin coatings on the lead stem, sufficient solder may not be available on the contact pad to form a satisfactory soldered connection between the contact pad and the lead, soldering cycle time is increased, and the use of flux-bearing solder preforms, so as to eliminate undesirable spray fluxing of the assembled leads and substrate circuit devices, is not practical.

A proposed solution to the above-mentioned problems is disclosed in copending patent application Ser. No. 231,569, now U.S. Pat. No. 4,345,814, filed Feb. 4, 1981, in the names of E. A. Gutbier and P. J. Ouellette, assigned to the same assignee as the subject application, and entitled "Solder-Bearing Lead Having Solder Flow-Control Stop Means." In this regard, the E. A. Gutbier et al. application discloses a solder flow-control stop formed on the electrical contact finger of a solder-bearing lead closely adjacent a solder preform to preclude flow of molten solder from the solder preform along the contact finger to the lead stem, and to direct flow of the molten solder directly over the sides of the contact finger by gravity to the contact pad engaged by the finger during a soldering operation. Additional solder flow-control stops also may be formed on the lead to preclude flow of the molten solder along the lead stem during the soldering operation.

Monson et al. U.S. Pat. No. 4,302,067 discloses a solder-bearing lead in which portions of a solder preform carried on an outer surface of a lead contact finger directly engage a contact pad on a substrate circuit device to facilitate flow of molten solder from the preform over the contact pad in a soldering operation. In this regard, in the Monson et al. patent the contact finger is crimped about the center of the solder preform so as to deform the preform into an hourglass or "bow-tie" configuration such that opposite ends of the preform engage the contact pad when the lead is mounted on the contact pad.

Copending patent application Ser. No. 402,631, filed on even date herewith in the name of R. D. Mackay and entitled "Solder-Bearing Lead Having A Solder Preform Engageable Directly With a Contact Pad," also discloses a solder-bearing lead in which a solder preform directly engages a contact pad on a substrate circuit device to facilitate flow of molten solder from the preform over the contact pad in a soldering operation. In this regard, in the R. D. Mackay application an inner surface of a contact finger of a lead is wrapped about the solder preform in a direction such that a surface portion of the preform projects from the contact finger for direct engagement with the contact pad when the lead is mounted on the contact pad. When the lead is temporarily subjected to heat in a soldering operation, the solder preform melts and flows directly over the contact pad and then resolidifies to form a soldered connection having an outer end portion of the contact finger embedded therein. In this regard, a purpose of this invention is to provide a solder bearing lead as disclosed in the Mackay application in which the contact clamping finger which carries the solder preform also directly engages the contact pad to which the lead is to be soldered, to produce an improved electrical and mechanical connection between the lead and the contact pad.

SUMMARY OF THE INVENTION

In accordance with the invention, a solder-bearing lead comprises an elongated stem and first and second resilient clamping fingers extending in opposed spaced relationship from the elongated stem. The first clamping finger defines an electrical contact which has an inner surface portion thereof wrapped about a solder preform in clamping relationship so that a surface portion of the solder preform and an outer end surface portion of the contact finger are disposed in opposed spaced relationship to a clamping portion of the second clamping finger. The surface portion of the preform and the outer end surface portion of the contact finger, together with the clamping portion of the second clamping finger, define a gap for receiving a substrate circuit device therebetween with a force-fit. The outer end surface portion of the contact finger also is essentially flush with the surface portion of the preform so that the outer end surface portion of the contact finger and the surface portion of the preform both engage a contact pad on the substrate circuit device when the lead is assembled with the device. Thus, as the solder preform melts and resolidifies to bond the contact finger to the contact pad, the outer end surface portion of the contact finger firmly engages the contact pad in electrical and mechanical contact therewith prior to becoming embedded in the resolidified solder.

BRIEF DESCRIPTION OF THE DRAWINGS

FIG. 1 is an elevational view of a portion of a strip of solder-bearing leads in accordance with the invention;

FIG. 2 is a partial side view of a solder-bearing lead in accordance with the invention, looking in the direction of the arrows 2—2 in FIG. 2;

FIG. 3 is a view similar to FIG. 2, showing the solder-bearing lead thereof after the lead has been assembled and soldered to a substrate circuit device;

FIG. 4 is a partial side view, similar to FIG. 2, of another embodiment of a solder-bearing lead in accordance with the invention; and FIG. 5 is a view similar to FIG. 4, showing the solder-bearing lead thereof after the lead has been assembled and soldered to a substrate circuit device.

DETAILED DESCRIPTION

Referring to FIGS. 1, 2 and 3, the invention as disclosed in these figures is directed to a solder-bearing lead 10 of a type wherein each lead carries a mechanically clamped solder preform 12 (FIGS. 1 and 2) for bonding the lead to a respective contact pad 14 (one shown in FIGS. 2 and 3) on a rigid substrate circuit device 16. More specifically, the solder preform 12 is carried on an inner surface 18 of a central resilient spring clamping finger 20 of the lead 10 which defines an electrical contact having opposite end portions of the preform projecting in a cantilevered fashion from opposite sides of the contact finger.

In accordance with this invention, the central contact finger 20 of each lead 10 is wrapped about the solder preform 12 so that an outer end surface portion 22 of the contact finger, and surface portions 24 of the solder preform on opposite sides of the finger outer end surface portion, are in opposed spaced relationship to a pair of outer resilient clamping fingers 26. The outer end surface portion 22 of the contact finger 20 also is essentially flush with the surface portions 24 of the solder preform 12 so that both the finger outer end surface portion and the preform surface portions directly engage the contact pad 14 on the substrate circuit device 16 when the lead 10 is assembled with the device. In this regard, in the embodiment of the invention shown in FIGS. 2 and 3, this is accomplished by forming an outer end portion of the contact finger 20 into the solder preform 12 during the fabrication of the lead 10, as shown in FIG. 2. Accordingly, when the solder preform 12 reaches a molten state in a soldering operation, as soon as the surface tension of the molten solder is reduced sufficiently by associated flux to permit flow of the solder, the preform flows directly over the surface of the contact pad 14 to form a soldered connection 28 between the contact finger 20 of the lead 10 and the contact pad. At the same time, the outer end surface portion 22 of the contact finger 20 firmly engages the contact pad 14 prior to becoming embedded in the resolidified solder, as shown in FIG. 3, to establish a strong and reliable electrical and mechanical connection with the contact pad.

More specifically, in the disclosed solder-bearing lead 10 the three resilient spring clamping fingers, consisting of the central contact finger 20 and the two outer clamping fingers 26, project from an enlarged end portion of a lead stem 30. The central contact finger 20 includes an essentially U-shaped connecting portion 32 which is reverse-bent with respect to the stem in a first direction, extending away from the outer clamping fingers 26. The central contact finger 20 further includes an arcuate clamping portion 34 which is reverse-bent with respect to the U-shaped connecting portion 32 in a second opposite direction extending toward the outer clamping fingers 26 and mechanically wrapped around the solder preform 12 to attach the preform to the inner surface 18 of the contact finger.

The outer end surface portion 22 of the clamping finger portion 34 and the surface portions 24 of the solder preform 12, cooperate with clamping portions 36 of the outer clamping fingers 26 to define opposite upper and lower sides of a gap 38, respectively, as viewed in FIG. 2 in which the substrate circuit device 16 is receivable with a slight force-fit for mounting the lead 10 on the substrate circuit device. Thus, when the substrate circuit device 16 is inserted into the gap 38, the contact pad 14 is directly engaged by both the surface portions 24 of the solder preform 12, and the outer end surface portion 22 of the clamping finger portion 34, causing slight flexing of the contact finger 20. Subsequently, when the solder preform 12 is melted to bond the contact finger 20 to the contact pad 14 in a soldering operation, the contact finger rebounds slightly toward the contact pad into firm engagement with the contact pad before the molten solder resolidifies to form the soldered connection 28, as above described.

The stems 30 and the resilient clamping fingers 20 and 26 of the leads 10 are formed of a base metal, such as phosphorous bronze, which is not readily wetted by solder when oxidized as a result of exposure to the atmosphere, and which is coated on opposite surfaces thereof with thin coatings (not shown) of a metal which is readily wetted by solder, such as tin. The tin coatings (not shown) facilitate the making of electrical soldered connections (such as the soldered connections 28) to the leads 10. The stems 30 of the leads 10 also are formed integrally with an elongated continuous apertured support rail 40 (FIG. 1) which subsequently is clipped from the stems after the leads 10 have been mounted on the substrate circuit device 16 and soldered to their respective contact pads 14 as shown in FIG. 3.

To preclude the flow of molten solder from the solder preform 12 along the central contact finger 20 to the stem 30, solder-confining stops (not shown) may be formed from oxidized base metal portions on the inner surface 18 and on an outer surface 44 of the contact finger, by removing portions of the above-mentioned solder-wettable metal coatings (not shown) during fabrication leads, as disclosed in the above-mentioned E. A. Gutbier U.S. Pat. No. 4,345,814. Similar oxidized base metal solder-confining stops (not shown) may be formed on the outer clamping fingers 26 and/or the stem 30, as desired.

The solder preforms 12 may each consist of an essentially cylindrical piece of a relatively malleable solder wire, such as a 60-40 tin-lead alloy. Preferably, however, the solder preforms 12 are of a flux-bearing type suitable for use in a progressive punch-and-die, such as the number 2879 or number 4147 rosin core solder available from the Alpha Metals Company of Newark, N.J., so as to eliminate or reduce the amount of supplemental spray fluxing required in the soldering of the leads 10.

While the invention as disclosed in FIGS. 1, 2 and 3 has been shown as applied to a solder-bearing lead such as the lead 10, in which the clamping portions 34 and 36 of the clamping fingers 20 and 26, respectively, extend essentially perpendicularly from one end of the stem 30, it is apparent that the invention also is applicable to other types of solder-bearing leads. For example, the invention may be used on solder-bearing leads of a type in which the clamping portions of the clamping fingers extend substantially parallel to the stem.

Referring to the embodiment of the invention shown in FIGS. 4 and 5, a lead 10' includes an outer end surface portion 22' of a contact finger 20' which is made flush with surface portions 24' of a solder preform 12' by swaging the thickness of an outer end portion of a clamping portion 34' of the contact finger to a tapered configuration in a swaging station in the above-mentioned progressive punch-and-die, prior to wrapping an inner surface 18' of the contact finger about the solder preform in the progressive punch-and-die. In other respects, the lead 10' is identical to the lead 10 shown in FIGS. 1, 2 and 3. Thus the finger outer end surface portion 22' and the solder preform surface portions 24' cooperate with clamping portions 36' of outer resilient clamping fingers 26' to define a gap 38' (FIG. 4) for receiving a substrate circuit device 16' having contact pads 14' (only one shown) thereon. The clamping portion 34' of the contact finger 20' also is connected to a lead stem 30' by a U-shaped, reverse-bent connecting portion 32'. Further, when the solder preform 12' melts and resolidifies during a soldering operation to form a soldered connection 28', as shown in FIG. 5, the contact finger 20' rebounds slightly toward the contact pad 14' so that the outer end surface portion 22' of the contact finger firmly engages the contact pad before the solder resolidifies, to form a reliable electrical and mechanical connection with the contact pad.

In summary, a new and improved solder-bearing lead, such as the lead 10 or 10', has been disclosed. By way of example, with reference to the lead 10, the electrical contact finger 20 is wrapped about the solder preform 12 so that both the outer end surface portion 22 of the contact finger and the surface portions 24 of the preform directly engage the associated contact pad 14 when the lead is mounted on the substrate circuit device 16. As a result, when the solder preform 12 is melted in a reflow-soldering operation, molten solder from the solder preform does not have to initially flow across oxidized side edges of the contact finger to the contact pad by gravity, but rather flows directly over the surface of the contact pad 14. At the same time, the outer end surface portion 22 of the contact finger 20 becomes firmly engaged with the contact pad 14 before the solder resolidifies to form the soldered connection 28, to produce a strong and reliable electrical and mechanical connection with the contact pad.

What is claimed is:

1. A solder-bearing lead, which comprises:
   an elongated stem;
   first and second resilient clamping fingers having opposed clamping portions extending in opposed spaced relationship from the elongated stem for the reception of a substrate therebetwen, the clamping portion of the first resilient clamping finger having an inner surface; and
   a solder preform attached to the inner surface of the clamping portion of the first resilient clamping finger and having a surface portion in opposed relationship to the clamping portion of the second resilient clamping finger:
   the clamping portion of the first resilient clamping finger being partially wrapped about the solder preform in a direction extending toward the clamping portion of the second resilient clamping finger and having an outer end portion which terminates adjacent the surface portion of the solder preform in opposed relationship to the clamping portion of the second resilient clamping finger, the outer end portion having an outer end surface portion essentially flush with the surface portion of the solder preform;
   the clamping portion of the second resilient clamping finger defining a respective side of a substrate-receiving gap, and the surface portion of the solder preform and the adjacent flush outer end surface portion of the clamping portion of the first resilient clamping finger defining an opposite respective side of the substrate-receiving gap such that both the first clamping finger outer end surface portion and the preform surface portion directly engage a contact pad on the substrate when the substrate is received in the substrate-receiving gap between the finger clamping portions.

2. The solder bearing lead as recited in claim 1, in which:
   the clamping portion of the first resilient clamping finger is connected to the lead stem by an essentially U-shaped connecting portion of the first resilient clamping finger which is reverse-bent with respect to the lead stem in a first direction extending away from the clamping portion of the second resilient clamping finger, with the clamping portion of the first resilient clamping finger being partially wrapped about the solder preform and being reverse-bent with respect to the U-shaped connecting portion in a second opposite direction extending toward the clamping portion of the second resilient clamping finger.

3. The solder-bearing lead as recited in claim 1, in which:
   the outer end portion of the clamping portion of the first resilient clamping finger is formed into the solder preform such that the outer end surface portion of the clamping portion is essentially flush with the surface portion of the solder preform.

4. A lead-substrate assembly, which comprises:
a lead having an elongated stem and first and second resilient clamping fingers having opposed clamping portions extending in opposed spaced relationship from the elongated stem;
a substrate disposed between the opposed clamping portions of the resilient clamping fingers;
a contact pad on the substrate; and
a solder mass bonded to the contact pad on the substrate;
the first resilient clamping finger of the lead further including an essentially U-shaped connecting portion which connects the clamping portion of the first resilient clamping finger to the lead stem, the U-shaped connecting portion being reverse-bent with respect to the lead stem in a first direction extending away from the contact pad on the substrate; and
the clamping portion of the first resilient clamping finger of the lead being reverse-bent with respect to the U-shaped connecting portion of the first resilient clamping finger in a second opposite direction extending toward the contact pad on the substrate, with an outer end portion of the clamping portion terminating adjacent the contact pad in firm engagement with the contact pad and being embedded in the solder mass to form an electrical and mechanical connection with the contact pad.

5. A lead-substrate assembly, as recited in claim 4, in which:
the clamping portion of the first resilient clamping finger is of essentially arcuate construction.

6. A lead-substrate assembly, as recited in claim 4, in which:
the outer end portion of the first resilient clamping finger has a thickness of a tapered configuration.

7. A solder-bearing lead, which comprises:
an elongated stem;
first and second resilient clamping fingers having opposed clamping portions extending in opposed spaced relationship from the elongated stem to define a gap for the reception of a substrate therebetween, the clamping portion of the first resilient clamping finger having an inner surface;
a solder preform attached to the inner surface of the clamping portion of the first resilient clamping finger and having a surface portion in opposed relationship to the clamping portion of the second resilient clamping finger;
the clamping portion of the first resilient clamping finger being partially wrapped about the solder preform in a direction facing toward the clamping portion of the second resilient clamping finger and having an outer end portion which is of a tapered configuration such that an outer end surface portion of the clamping finger outer end portion is essentially flush with the surface portion of the solder preform, and such that both the clamping finger outer end surface portion and the preform surface portion directly engage a contact pad on the substrate when the substrate is received between the finger clamping portions.

8. A solder-bearing lead, which comprises:
an elongated stem;
first and second resilient clamping fingers having opposed clamping portions extending in opposed spaced relationship from the elongated stem for the reception of a substrate therebetween, the clamping portion of the first resilient clamping finger having an inner surface;
a solder preform attached to the inner surface of the clamping portion of the first resilient clamping finger and having a surface portion in opposed relationship to the clamping portion of the second resilient clamping finger;
the clamping portion of the first resilient clamping finger being partially wrapped about the solder preform in a direction extending toward the clamping portion of the second resilient clamping finger and having an outer end portion which terminates adjacent the surface portion of the solder perform in opposed relationship to the clamping portion of the second resilient clamping finger, the outer end portion of the clamping finger being of tapered construction such that an outer end surface portion of the clamping finger outer end portion is essentially flush with the surface portion of the solder preform; and
the clamping portion of the second resilient clamping finger defining a respective side of a substrate-receiving gap, and the surface portion of the solder preform and the adjacent flush outer end surface portion of the clamping portion of the first resilient clamping finger defining an opposite respective side of the substrate-receiving gap such that both the first clamping finger outer end surface portion and the preform surface portion directly engage a contact pad on the substrate when the substrate is received in the substrate-receiving gap between the finger clamping portions.

* * * * *